United States Patent
Knaapen et al.

(10) Patent No.: US 8,780,321 B2
(45) Date of Patent: Jul. 15, 2014

(54) LITHOGRAPHIC APPARATUS AND DEVICE MANUFACTURING METHOD

(75) Inventors: Thijs Egidius Johannes Knaapen, Eindhoven (NL); Richard Joseph Bruls, Eindhoven (NL); Youri Johannes Laurentius Maria Van Dommelen, Ballston Lake, NY (US); Johannes Henricus Wilhelmus Jacobs, Heeze (NL); Martijn Hendrik Kamphuis, Veldhoven (NL); Paulus Martinus Maria Liebregts, Veldhoven (NL); Rudolf Adrianus Joannes Maas, Eindhoven (NL); Marco Koert Stavenga, Eindhoven (NL); Coen Cornelis Wilhelmus Verspaget, Helmond (NL); Rudy Jan Maria Pellens, Overpelt (BE); Jan Cornelis Van Der Hoeven, Veldhoven (NL); David Lucien Anstotz, Eindhoven (NL); Gert-Jan Gerardus Johannes Thomas Brands, Waalre (NL); Marcus Johannes Van Der Zanden, Boekel (NL); Vijay Kumar Badam, Eindhoven (NL); Casper Roderik De Groot, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 560 days.

(21) Appl. No.: 12/631,113

(22) Filed: Dec. 4, 2009

(65) Prior Publication Data
US 2010/0157260 A1 Jun. 24, 2010

Related U.S. Application Data

(60) Provisional application No. 61/193,576, filed on Dec. 8, 2008, provisional application No. 61/167,047, filed on Apr. 6, 2009.

(51) Int. Cl.
*G03B 27/52* (2006.01)
*G03F 7/20* (2006.01)

(52) U.S. Cl.
CPC ........ *G03F 7/70925* (2013.01); *G03F 7/70341* (2013.01)
USPC ................................ 355/30; 355/53; 355/72

(58) Field of Classification Search
CPC ............ G03F 7/70341; G03F 7/70908; G03F 7/70916; G03F 7/70925
USPC .......................... 355/30, 53, 72; 356/399–401
See application file for complete search history.

(56) References Cited

U.S. PATENT DOCUMENTS

| 4,509,852 | A | 4/1985 | Tabarelli et al. |
| 6,955,074 | B2 | 10/2005 | Levasier et al. |

(Continued)

FOREIGN PATENT DOCUMENTS

| CN | 1700098 | 11/2005 |
| CN | 1918516 | 2/2007 |

(Continued)

OTHER PUBLICATIONS

Japanese Office Action mailed Nov. 22, 2011 in corresponding Japanese Patent Application No. 2009-268224.

(Continued)

*Primary Examiner* — Steven H Whitesell Gordon
(74) *Attorney, Agent, or Firm* — Pillsbury Winthrop Shaw Pittman LLP

(57) ABSTRACT

A lithographic apparatus having a table including a target and/or a sensor and a liquid displacing device to displace liquid from the target and/or sensor using a localized gas flow is disclosed. The liquid displacement device may be positioned at various positions, e.g. mounted to a liquid handling device at an exposure station, adjacent or in a transfer path between the exposure station and a measurement station, at a load/unload station or adjacent a sensor.

21 Claims, 7 Drawing Sheets

(56) References Cited

U.S. PATENT DOCUMENTS

| | | | |
|---|---|---|---|
| 7,017,390 B1 | 3/2006 | Vogel | |
| 7,342,640 B2 | 3/2008 | Kamono | |
| 7,388,649 B2 | 6/2008 | Kobayashi et al. | |
| 7,394,522 B2* | 7/2008 | Hasegawa et al. | 355/53 |
| 7,528,931 B2 | 5/2009 | Modderman | |
| 7,616,383 B2 | 11/2009 | Streefkerk et al. | |
| 2004/0136494 A1 | 7/2004 | Lof et al. | |
| 2004/0207824 A1 | 10/2004 | Lof et al. | |
| 2006/0007419 A1 | 1/2006 | Streefkerk et al. | |
| 2006/0038968 A1 | 2/2006 | Kemper et al. | |
| 2006/0077367 A1* | 4/2006 | Kobayashi et al. | 355/53 |
| 2006/0119809 A1 | 6/2006 | Verhagen et al. | |
| 2006/0132733 A1 | 6/2006 | Modderman | |
| 2007/0186621 A1* | 8/2007 | Kochersperger et al. | 73/37.5 |
| 2007/0263191 A1* | 11/2007 | Shibazaki | 355/53 |
| 2007/0268466 A1 | 11/2007 | Leenders et al. | |
| 2008/0007704 A1 | 1/2008 | Leenders et al. | |
| 2008/0055574 A1 | 3/2008 | Kamono | |
| 2008/0192214 A1 | 8/2008 | Leenders et al. | |
| 2008/0202201 A1 | 8/2008 | Boesser et al. | |
| 2008/0212046 A1 | 9/2008 | Riepen et al. | |
| 2009/0002651 A1* | 1/2009 | To | 355/30 |
| 2011/0222037 A1 | 9/2011 | Kiuchi et al. | |

FOREIGN PATENT DOCUMENTS

| | | |
|---|---|---|
| CN | 101258581 | 9/2008 |
| EP | 1 420 300 A2 | 5/2004 |
| EP | 1 598 705 | 11/2005 |
| EP | 1 632 813 | 3/2006 |
| EP | 2008-523588 | 7/2008 |
| JP | 2005-277363 | 10/2005 |
| JP | 2007-109741 | 4/2007 |
| JP | 2007-115730 | 5/2007 |
| JP | 2007-318117 | 12/2007 |
| JP | 2008-258381 | 10/2008 |
| WO | WO 99/49504 A1 | 9/1999 |
| WO | 2004/053952 | 6/2004 |
| WO | 2004/102646 | 11/2004 |
| WO | 2004/105107 | 12/2004 |
| WO | WO 2005/064405 A2 | 7/2005 |
| WO | 2007/097350 | 8/2007 |

OTHER PUBLICATIONS

Chinese Office Action dated Sep. 26, 2011 in corresponding Chinese Patent Application No. 200910253825.3.

Taiwan Office Action dated Mar. 25, 2013 in corresponding Taiwan Patent Application No. 098140408.

Taiwan Office Action dated Aug. 8, 2013 in corresponding Taiwan Patent Application No. 098140408.

U.S. Appl. No. 61/071,621, filed May 8, 2008, Direcks et al.

U.S. Appl. No. 61/136,380, filed Sep. 2, 2008, Tanasa et al.

* cited by examiner

LITHOGRAPHIC APPARATUS AND DEVICE MANUFACTURING METHOD

This application claims priority and benefit under 35 U.S.C. §119(e) to U.S. Provisional Patent Application Ser. No. 61/193,576, entitled "Lithographic Apparatus and Device Manufacturing Method", filed on Dec. 8, 2008, and to U.S. Provisional Patent Application Ser. No. 61/167,047, entitled "Lithographic Apparatus and Device Manufacturing Method", filed on Apr. 6, 2009. The contents of those applications are incorporated herein in their entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may form a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate W (as indicated by an arrow in FIG. 3), preferably along the direction of movement of the substrate W relative to the final element, and is removed by at least one outlet OUT after having passed under the projection system PS (as indicated by an arrow in FIG. 3). That is, as the substrate W is scanned beneath the element in a −X direction, liquid is supplied at the +X side of the element and taken up at the −X side, FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible, one example is illustrated in FIG. 3 in which four sets of an inlet IN with an outlet OUT on either side are provided in a regular pattern around the final element.

A further immersion lithography solution with a localized liquid supply system is shown in FIG. 4. Liquid is supplied by two groove inlets IN on either side of the projection system PS as represented in the Figure by arrows and is removed by a plurality of discrete outlets OUT arranged radially outwardly of the inlets IN as represented by arrows. The inlets IN and OUT can be arranged in a plate with a hole in its center and through which the projection beam is projected. Liquid is supplied by one groove inlet IN on one side of the projection system PS and removed by a plurality of discrete outlets OUT on the other side of the projection system PS, causing a flow of a thin film of liquid between the projection system PS and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. US 2004-0136494, the idea of a twin or dual stage immersion lithography apparatus is disclosed. Such an apparatus has two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

SUMMARY

A liquid film or droplet (herein after reference to a droplet includes reference to a film) left on the substrate table after exposure of a substrate may cause a problem. In particular, when a droplet evaporates it may locally cool the surface from which it evaporates. Localized cooling of the surface may cause temporary or permanent deformation thereof. In addition or alternatively, a drying stain may be left behind. Such problems are particularly acute if the surface on which the droplet was left is a part of a sensor, or a target of a sensor that makes measurements in the dry state, i.e. without liquid between sensor and target. In this case, if the droplet is still present when a measurement is taken, an erroneous measurement may result.

In a so-called dual-stage lithographic apparatus, a substrate is first loaded onto a substrate table, various measurements are made at a measurement station and then the table and substrate are transferred to an exposure station to be exposed. After all exposures on the substrate are complete, the exposed substrate is unloaded and a new substrate loaded onto the table. A liquid droplet left on the substrate table after exposure of the preceding substrate may therefore adversely affect measurements made on the succeeding substrate, either by its presence or by the effects of its evaporation.

It is desirable, for example, to provide a lithographic apparatus in which a potentially adverse effect of a liquid droplet left on a substrate table, e.g., after exposure of a substrate, is reduced.

According to an aspect of the invention, there is provided a lithographic apparatus comprising:

a table configured to support a substrate, a sensor, or both the substrate and the sensor, the table having a surface and a sensor, a target for a sensor on the surface, or both the sensor and the target;

a liquid handling structure to provide liquid to a space adjacent the substrate and/or table; and a liquid displacement device comprising a gas outlet configured to direct a localized gas flow toward the sensor and/or target so as to displace liquid from the sensor and/or target.

According to an aspect of the invention, there is provided device manufacturing method comprising:

projecting an image of a pattern through an immersion liquid onto a first substrate held by a substrate table having a target, a sensor, or both the target and sensor;

unloading the first substrate from the substrate table;

loading a second substrate onto the substrate table;

measuring a property of the target or using the sensor while the second substrate is held by the substrate table; and displacing liquid from the target and/or the sensor using a localized gas flow.

According to an aspect of the invention, there is provided device manufacturing method comprising:

projecting an image of a pattern through an immersion liquid onto a first substrate held by a substrate table, the immersion liquid being confined between a projection system and the substrate by a liquid confinement structure;

moving the liquid confinement structure to a measurement table having a target, a sensor, or both the target and sensor, or moving the measurement table to the liquid confinement structure;

unloading the first substrate from the substrate table;

loading a second substrate onto the substrate table;

measuring a property of the target or using the sensor; and displacing liquid from the target and/or sensor using a localized gas flow.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
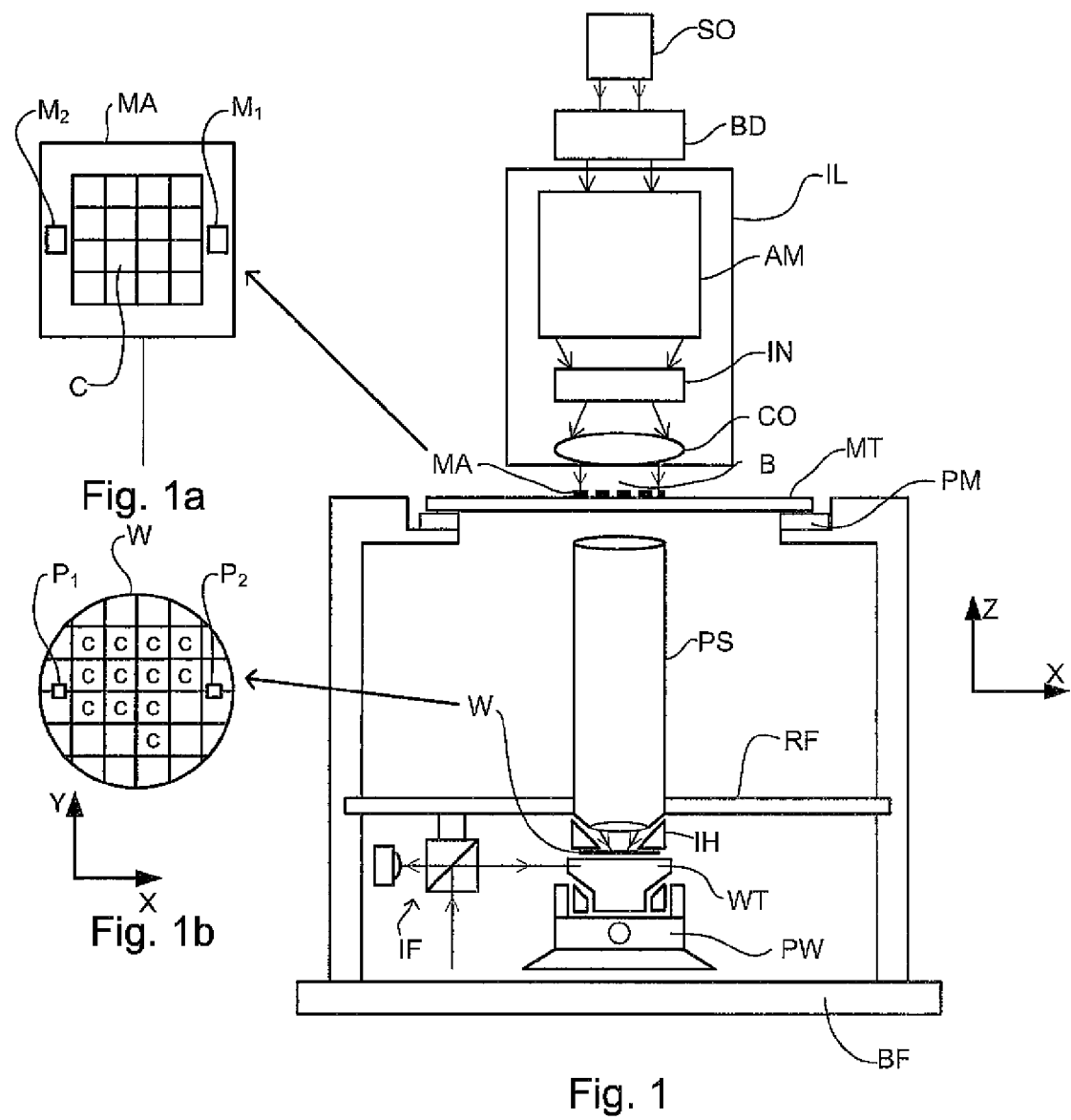
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a substrate table (e.g. a wafer table) WT constructed to hold a substrate (e.g. a resist-coated wafer) W and connected to a second positioner PW configured to accurately position the substrate W in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan.

In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type (or submersed) arrangement and the so called localized immersion system. In the submersed arrangement, in which substantially the whole of the substrate and optionally part of the substrate table is submersed in a liquid, such as in a bath or under a film of liquid. The localized immersion systems uses a liquid supply system to provide liquid to a localized area of the substrate. In the latter category, the space filled by liquid is smaller in plan than the top surface of the substrate. The volume of liquid in the space that covers the substrate remains substantially stationary relative to the projection system while the substrate moves underneath that space.

Figure 2:
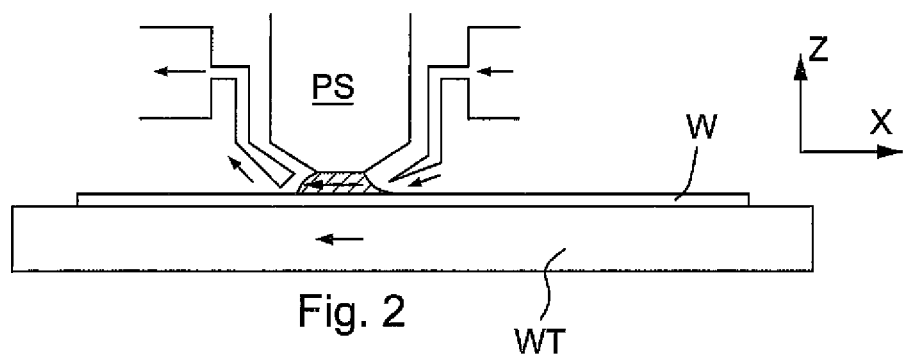
FIGS. 2 and 3 depict a liquid supply system for use in a lithographic projection apparatus.
Figure 3:
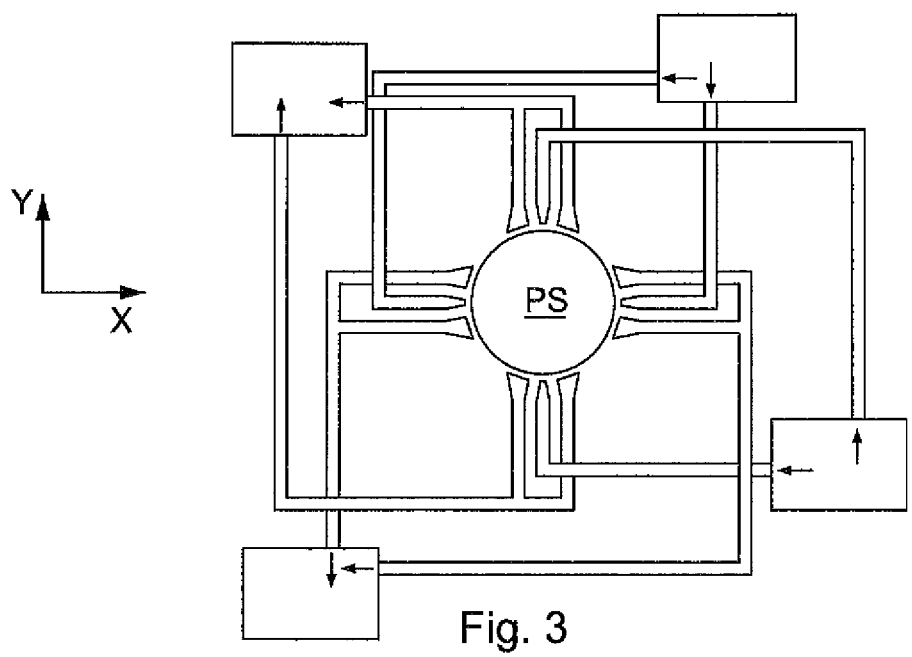
Figure 4:
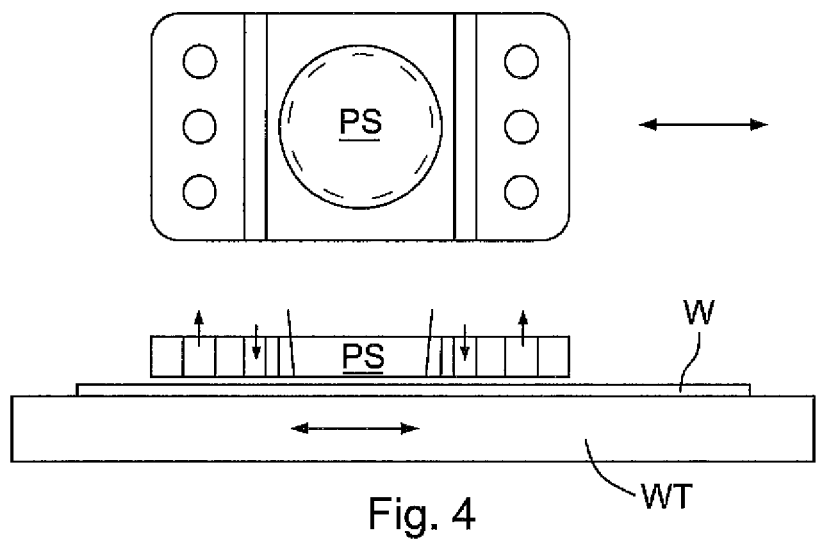
FIG. 4 depicts a further liquid supply system for use in a lithographic projection apparatus.

A further arrangement, to which an embodiment of the present invention is directed, is the all wet solution in which the liquid is unconfined. In this arrangement, substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system. However, sealing features are not present in the liquid supply device, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 are described above.

Figure 5:
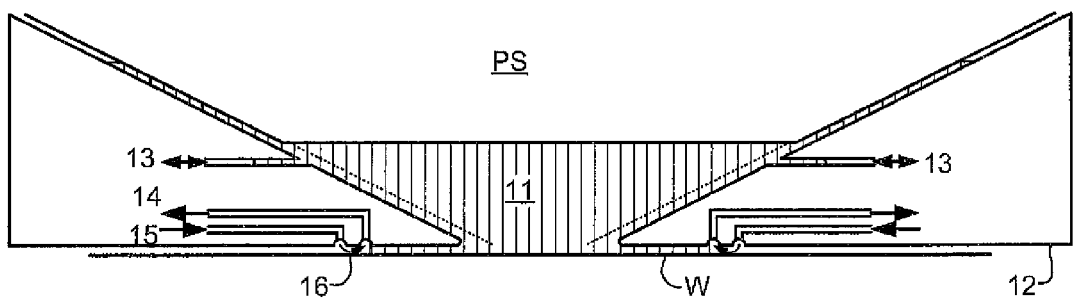
FIG. 5 depicts a further liquid supply system for use in a lithographic projection apparatus.

Another arrangement which has been proposed is to provide the liquid supply system with a liquid confinement structure which extends along at least a part of a boundary of the space between the final element of the projection system and the substrate table. Such an arrangement is illustrated in FIG. 5. The liquid confinement structure is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system or fluid handling structure with a barrier member or fluid confinement structure 12, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The fluid confinement structure 12 is substantially stationary relative to the projection system PS in the XY plane though there may be some relative movement in the Z direction (in the direction of the optical axis). In an embodiment, a seal is formed between the fluid confinement structure 12 and the surface of the substrate W and may be a contactless seal such as a gas seal or fluid seal.

The fluid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the fluid confinement structure 12 positioned below and surrounding the final element of the projection system PS. Liquid is brought into the space 11 below the projection system PS and within the fluid confinement structure 12 by liquid inlet 13. The liquid may be removed by liquid outlet 13. The fluid confinement structure 12 may extend a little above the final element of the projection system PS. The liquid level rises above the final element so that a buffer of liquid is provided. In an embodiment, the fluid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid is contained in the space 11 by the gas seal 16 which, during use, is formed between the bottom of the fluid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between fluid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the fluid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor (whether or not it works in two phase mode) as disclosed, for example, in United States patent application publication no US 2006-0038968. In an embodiment, a single phase extractor may comprise an inlet which is covered in a porous material which is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 50 µm. In an embodiment, the porous material is at least slightly liquidphilic (e.g., hydrophilic), i.e. having a contact angle of less than 90° to the immersion liquid, e.g. water. In an embodiment, the liquid handling system may have an opening, such as an outlet, covered with a porous member.

Another arrangement which is possible is one which works by extracting two phase fluid and may be referred to as a gas drag principle. The so-called gas drag principle has been described, for example, in United States patent application publication no. US 2008-0212046 and U.S. patent application No. 61/071,621 filed on 8 May 2008. In that system the extraction holes are arranged in a shape which desirably has a corner. The corner may be aligned with the stepping and scanning directions. This reduces the force on the meniscus between two openings in the surface of the fluid handling structure for a given speed in the step or scan direction compared to if the two outlets were aligned perpendicular to the direction of scan.

An embodiment of the invention may be applied to a fluid handling structure used in an all wet immersion apparatus. In the all wet embodiment, fluid is allowed to cover substantially the whole of the top surface of the substrate table, for example, by allowing liquid to leak out of a confinement structure which confines liquid to between the final element of projection system and the substrate. An example of a fluid handling structure for an all wet embodiment can be found in U.S. patent application No. 61/136,380 filed on 2 Sep. 2008.

In an immersion lithographic apparatus, immersion liquid may be left on the substrate table after completion of exposures of a substrate. This will almost always occur in an unconfined or all wet immersion apparatus but may also occur in a localized immersion apparatus if droplets escape from the liquid containment structure. Such a droplet left behind on the substrate table may be undesirable. In particular, a substrate table, as well as supporting a substrate, often has one or more sensor devices or targets in its surface. For example, in a dual-stage lithographic apparatus, the substrate table may be provided with one or more fiducials. A fiducial is used during the pre-measurement phase prior to exposure of the substrate. In particular, the fiducial may be used as a reference point to establish the positions of markers on the substrate. A fiducial may comprise a marker detectable by an alignment sensor, correspond to an alignment marker on a substrate, and be permanently formed in a fixed plate. An image sensor, such as a Transmission Image Sensor (TIS), may be located underneath or in fixed relationship to the marker. A fiducial may also include a flat area acting as a reference plane for a level or height sensor. Other sensors or sensor targets that may be included in the substrate table include a grid plate for a position encoding system, an energy sensor and/or an interferometric aberration sensor.

The presence of residual immersion liquid, such as water, on such a sensor or sensor target may cause a problem. The presence of residual immersion liquid in the form of a droplet when a measurement is being taken can cause an erroneous reading if the measurement system and procedure is designed to make a measurement in the dry state. Evaporation of a residual immersion liquid droplet may leave behind a drying stain. A drying stain may affect a measurement or may cause localized cooling. Localized cooling may cause deformation of the sensor, e.g. a reference sensor. In this way an erroneous sensor measurement may be made. A sensor or sensor target may have a liquidphilic surface, i.e. a surface that attracts liquid, or a surface that becomes liquidphilic during use of the apparatus, e.g. through exposure to radiation. Thus liquid may often be present on the sensor or sensor target.

An embodiment of the invention addresses one or more of these (or other) undesirable outcomes by providing a liquid displacement device. The liquid displacement device is arranged to displace liquid from the sensor or sensor target by use of a localized gas flow directed towards the sensor and/or target. In an embodiment, the gas may be: air; a clean, dry gas, such as air; a gas which is an artificial air; and/or $N_2$ or another inert gas, such as a noble gas. Since the sensor or target is usually a relatively small area on the substrate table, it may be sufficient merely to displace any liquid droplet that is on the sensor or target to an adjacent area of the substrate table where its presence may cause no harm or substantially no risk of harm or damage. Alternatively, the liquid droplet may be completely removed from the substrate table.

It is desirable to remove the liquid droplet from the substrate table, or at least the sensor or target, as soon as possible, in order to help minimize evaporative effects. According to an embodiment of the invention shown in FIGS. 6 and 7, a liquid displacement device 20 is shown attached to the fluid confinement structure 12. In an embodiment the displacement device may be a gas knife 15 as described with reference to FIG. 5.

Figure 6:
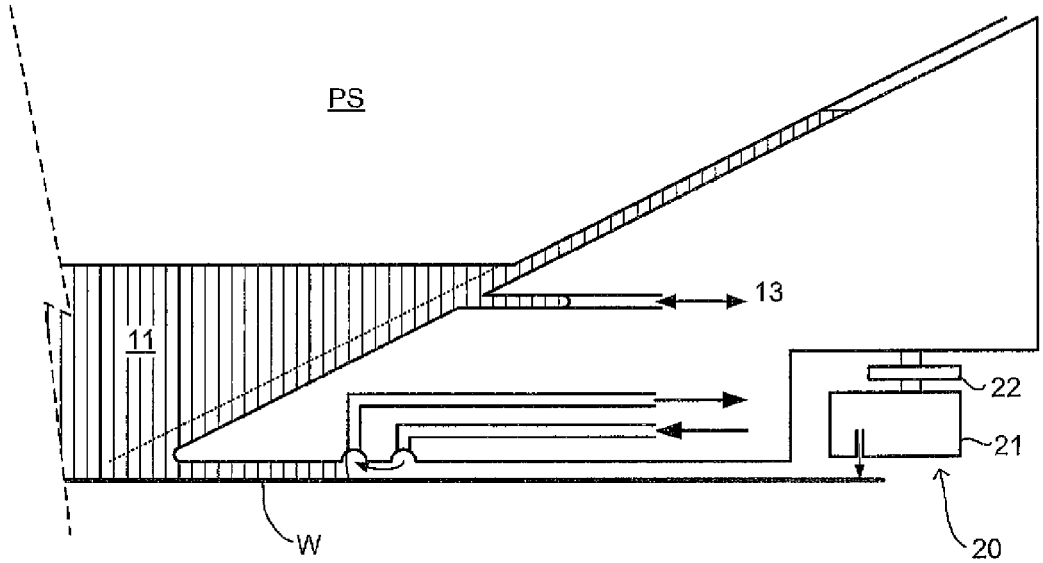
FIG. 6 is an enlarged sectional view of a liquid handling system including a liquid displacement device according to an embodiment of the invention.
Figure 7:
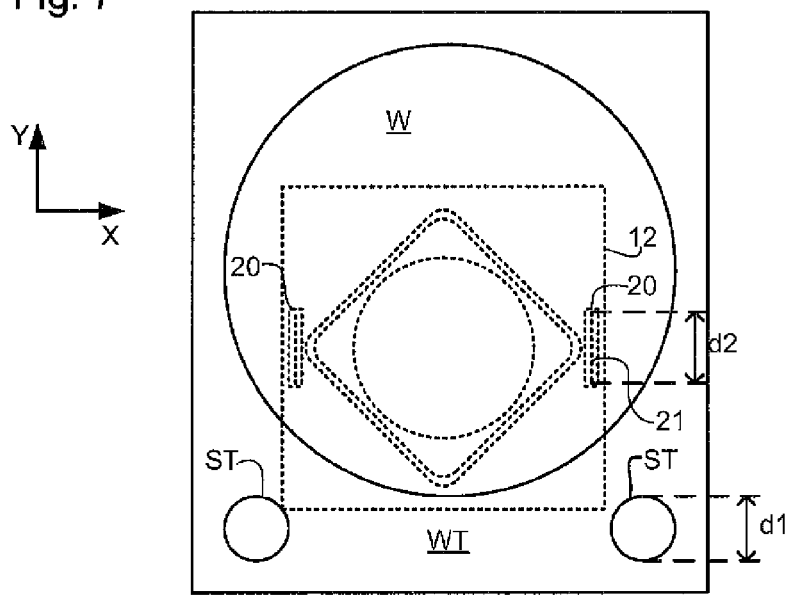
FIG. 7 is a plan view of a substrate table showing in phantom the liquid handling system of FIG. 6.

In the embodiment shown in FIGS. 6 and 7, the liquid displacement device 20 comprises a gas knife device 21 which is connected to the fluid confinement structure 12 via an actuator 22. The actuator 22 allows the gas knife 21 to be raised and lowered. It is lowered, for example, to an operative position for use in removing a droplet from the surface of a sensor target. The gas knife 21 may be raised, for example, to a storage position when not required.

A suitable actuator, for example a solenoid or a motor and cam, may be used to raise and lower the gas knife 21. The actuator may include a pneumatic system. In an embodiment, the gas knife 21 is mounted so as to be displaceable vertically and biased, such as resiliently biased for example by a spring, to a position away from the substrate or substrate table. The actuator 22 may be provided with a bellows or piston that is filled by a gas when the gas supply to the gas knife is turned on. The bellows or piston is arranged so that when filled with gas it urges the gas knife to the operative position. The gas knife 21 is thereby automatically moved to the operative position when activated. A stop may be provided to define the position of the gas knife when in the active state, i.e. at the operative position. In an embodiment, the operative position of the gas source is such that its undersurface is further away from the surface of the opposing surface of the substrate and/or substrate table than the distance between an undersurface of the liquid confinement structure radially inwards from the gas knife and the opposing surface of the substrate and/or substrate table. This is because in the region of the gas knife, droplets may otherwise contact the undersurface and scatter dispersing contamination and immersion liquid.

As can be seen in FIG. 7, the gas knife 21 has a length d2 in a Y direction, for example substantially parallel to an edge of the substrate table WT. The length d2 is at least slightly greater than the dimension, e.g. diameter, d1, of the sensor ST or target ST in that direction, i.e. the Y direction which may be substantially parallel to an edge of the substrate table WT. The gas knife 21 thus generates a localized gas flow. In an embodiment of the invention, d2 is no greater than 115% of d1, desirably no greater than 110%. The distance d2 is desirably at least equal to the length d1 so that the entire sensor can be swept clean in a single pass of the sensor/target under the gas knife (or of the gas knife over the sensor/target). In an embodiment, it is possible to have a smaller localized gas knife, for example one which has a length smaller than the dimension of the sensor/target ST. Then the localized gas knife may clean the sensor/target ST in multiple passes. Although shown as straight, the gas knife 21 may be curved or bent. In that case the width of the area swept by the gas knife across the sensor/target ST should meet the aforementioned conditions. In this paragraph, a reference to a dimension of either the gas knife 21 or the sensor/target ST, should be read as a dimension of that component in a direction perpendicular to the direction of relative motion of the substrate table WT and the gas knife when the sensor is swept. In a known immersion lithographic apparatus, a liquid confinement structure has a gas knife extending around the entire periphery (e.g., circumference) of the liquid confinement structure as part of the arrangements to confine liquid to the space below the projection system. Such a gas knife may be operated to sweep a sensor/target ST on the substrate table if the range of movement of the substrate table allows. However, such a gas knife can be a cause of defectivity. Hence a localized gas knife is desirable and it is desirable only to operate the gas knife when required.

The localized gas knife 21 should have a flow of gas, sufficient to displace any liquid droplet that may be present on the sensor or target. The efficiency of the device is enhanced if the gas flow rate is high and the gas outlet is arranged to form a pressure peak directly below the gas outlet when in operation. In an embodiment, the gas may be: air; clear dry gas, such as air; artificial air; and/or $N_2$ or another inert gas.

Operation of the localized gas knife may move a droplet away from the sensor or target. The droplet may be left on the surface of the substrate table away from the sensor/target ST. The localized gas knife 21 may direct a droplet towards the liquid in the immersion space 11. The droplet may join the liquid 11 and/or may be extracted.

As shown in FIG. 7, the localized gas knife 21 is desirably provided on a side of the liquid confinement structure 12 such that it can sweep the sensor/target ST with a minimum of additional scanning. Desirably additional scanning over and above the scanning performed for exposures is not required. Where the substrate table contains multiple areas to be specifically swept of liquid, for example multiple sensors or targets, a corresponding number of suitably placed liquid displacement devices 20 may be provided. For example, as shown in FIG. 7, there are two sensors/targets ST and two liquid displacement devices 20.

Figure 8:
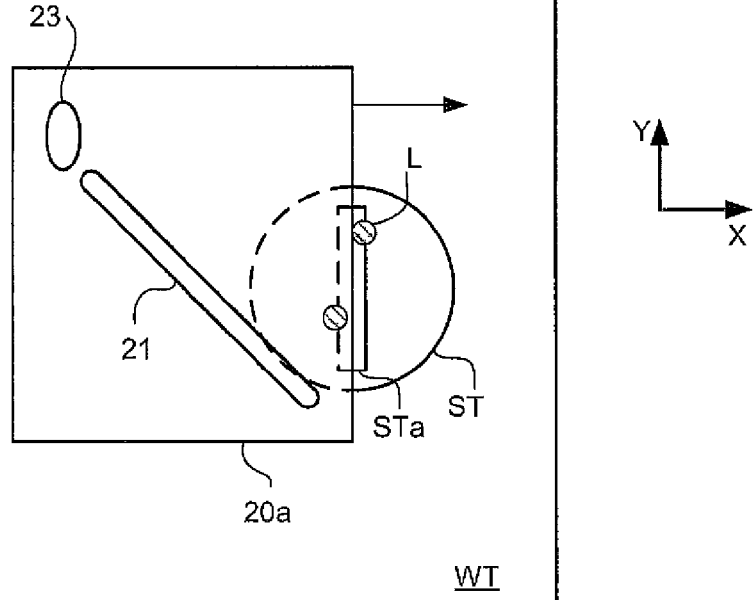
FIG. 8 is a schematic illustration of a liquid displacement device according to an embodiment of the invention.
Figure 9:
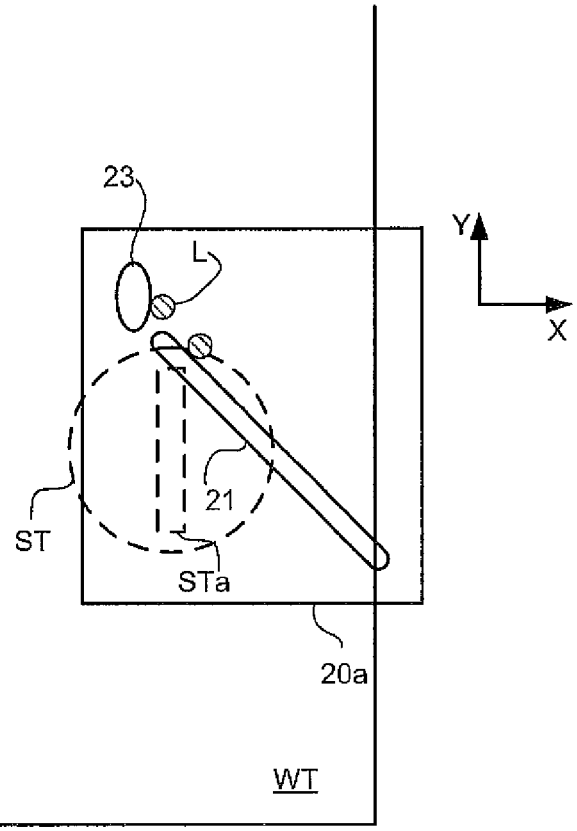
FIG. 9 is a schematic illustration of the liquid displacement device of FIG. 8 in operation.

A further form of liquid displacement device is shown in FIG. 8. FIG. 8 also assists in showing its manner of operation in combination with FIG. 9. The liquid displacement device is described in U.S. patent application publication no. 2008/0007704 and is hereby incorporated by reference in its entirety. In FIG. 8 the liquid displacement device 20a is shown at the beginning of the scan over sensor/target ST (and/or the sensor/target ST is shown at the beginning of the scan under the liquid displacement device 20a). FIG. 9 shows the operation of the liquid displacement device part way through such a scan.

As shown in FIG. 8, the liquid displacement device 20a comprises a gas knife 21 and a two-phase extraction port 23. The gas knife 21 is arranged, e.g. set, at an angle to the direction, e.g. the X direction, of the aforementioned scan. The two-phase extraction port 23 is positioned near, such as adjacent to, one end of the gas knife 21. As shown in FIG. 9, as the liquid displacement device 20a scans past the sensor/target ST, the liquid L, e.g. in the form of a droplet, remaining on the sensor/target ST is swept by the gas knife 21. The gas knife 21 removes the droplet from the sensor/target ST. The gas knife 21 moves the droplet towards the two-phase extraction port 23.

The width of the gas knife 21 in the liquid displacement device 20a in a direction perpendicular to its direction of movement relative to the sensor/target ST, e.g. the Y direction, meets the same conditions as for the gas knife 21 of the liquid displacement device 20 described above with respect to FIG. 7. That is, the width d2 of the gas knife 21 meets the aforementioned conditions relative to the width d1 of the active area STa of the sensor/target ST in the direction of relative movement between the gas knife 21 and the sensor/target ST. In an embodiment, the liquid displacement device 20a is switched on when required and off when not required. For example, the liquid displacement device is operative when the liquid displacement device 20a is facing the surface of the sensor/target ST.

Figure 10:
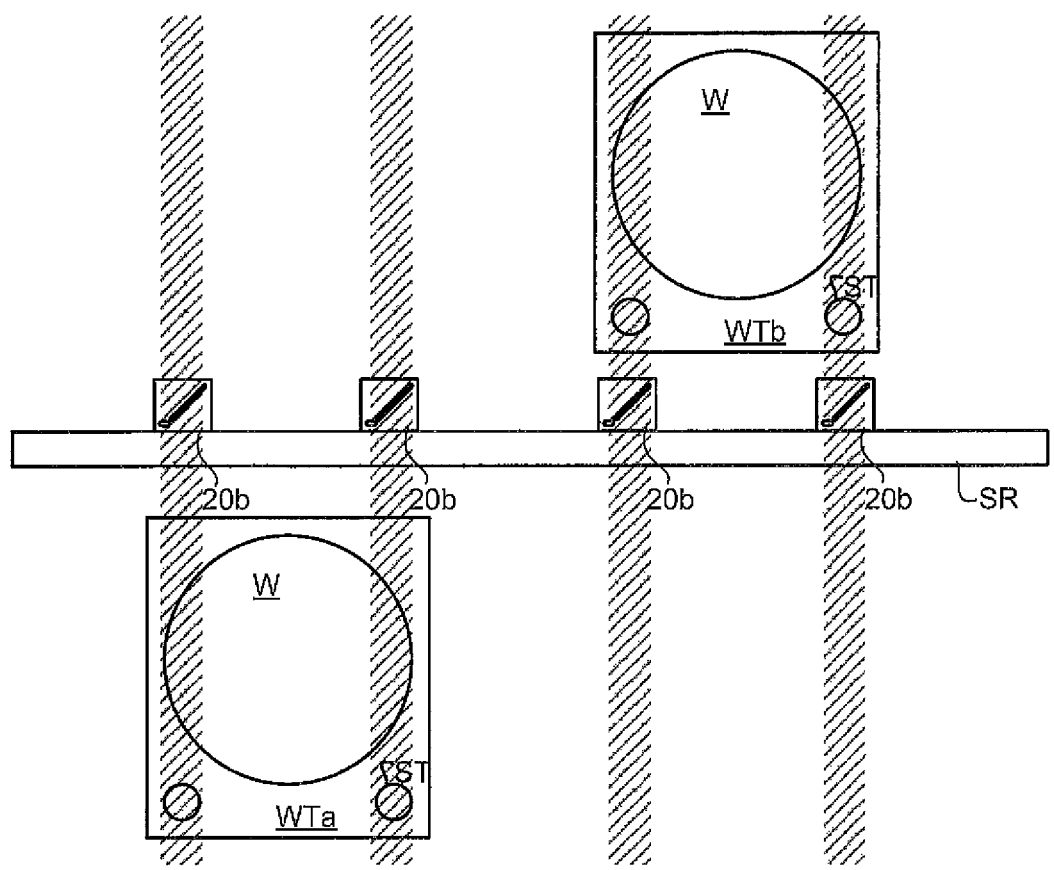
FIG. 10 depicts a liquid displacement device according to an embodiment of the invention.

FIG. 10 shows an embodiment of the invention in which residual liquid is displaced from the sensor/target ST during transfer of substrate table from an exposure station ES to a measurement station MS in a dual-stage lithographic apparatus. The exposure station ES has the projection system PS. The exposure station ES is where a substrate is exposed to form a desired pattern. The measurement station MS has one or more sensors to measure a property of the substrate. The measurement station MS is where characterization steps prior to exposure are carried out. The characterization steps may include characterization of a property of a substrate W. The characterization may comprise measurement of a property of the substrate W. After one substrate has been fully exposed and another substrate fully characterized, the substrate table carrying the exposed substrate is moved to the measurement station and the substrate table carrying the characterized substrate is moved to the exposure station. This procedure may be referred to as a "swap".

In this embodiment, a liquid displacement device 20b, desirably more than one, is positioned adjacent the path or paths taken by the substrate tables in moving from the measurement station to the exposure station and vice versa. In order to avoid collision between the substrate tables, the path taken by the substrate tables in moving between the two stations are fixed. Therefore, one or more liquid displacement devices 20b can be set in fixed position so as to clean the sensor/target ST on each of the substrate tables during the swap procedure.

In an embodiment, the liquid displacement device 20b is mounted to a securing device which enables the liquid displacement device to move relative to the surface of the substrate table WT. In an embodiment, the securing device may allow the liquid displacement device to move relative to the projection system PS. In FIG. 10, the securing device is a rail SR. In an embodiment, the liquid displacement device 20b may move along a rail on which it is mounted. The liquid displacement device may comprise an actuator, such as a motor, to achieve the movement. In an embodiment, the liquid displacement device may be connected to an actuable arm.

As can be seen in FIG. 10, there are a plurality of liquid displacement devices 20b. The liquid displacement devices 20b are each mounted on a rail SR. The liquid displacement devices 20b are each mounted on the rail at a position so that a sensor/target ST is moved under a liquid displacement device 20b, i.e. as the substrate table WTa, WTb passes under the rail SR. When a liquid displacement device is operational, the sensor/target ST is swept by the liquid displacement device 20b.

In the embodiment shown in FIG. 10, there are two substrate tables WTa, WTb, each having two sensors/targets ST. In this case, as each substrate table WTa, WTb follows its own path underneath the rail SR, four liquid displacement devices are provided. If a different number of tables are used, for example in a system with an exposure stage and a measurement stage, a different number of sensor targets are present, or more than one table uses the same path between the exposure and measurement stations, the arrangement of the liquid displacement devices 20b may be different. For example, a different number of liquid displacement devices may be required. In an apparatus having multiple measurement stations, one or more liquid displacement devices may be provided at appropriate positions adjacent each transfer path between the exposure station and a measurement station. The liquid displacement device 20b in this embodiment may be of the type of liquid displacement device 20 shown in FIGS. 6 and 7 or the type of liquid displacement device 20a shown in FIGS. 8 and 9.

Figure 11:
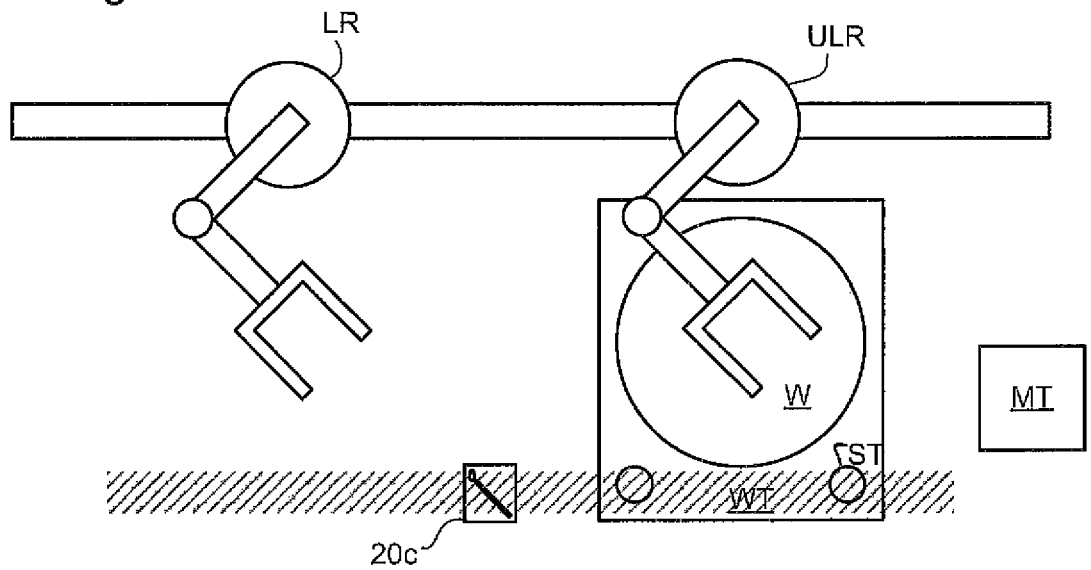
FIG. 11 depicts a liquid displacement device according to an embodiment of the invention.

An embodiment of the invention is shown in FIG. 11. In this embodiment the liquid displacement device 20c is located at a load/unload station of the lithographic apparatus. At the load/unload station is an actuable arm which is configured to position a substrate on a substrate table WT, remove a substrate from the substrate table WT, or both position and remove a substrate. The substrate table may be at a load position to place a substrate onto the substrate table, or at an unload position for the removal of the substrate, by the actuable arm. The unload and load positions may be the same position of the substrate table. The actuable arm may be a load robot LR, an unload robot ULR, or both. After exposure of a substrate, the substrate table carrying the substrate is moved to the unload position, adjacent the unload robot. The unload robot ULR may remove the exposed substrate W from substrate table WT. The substrate table WT may be moved to the load position, adjacent load robot LR. Load robot LR then places a new, to be exposed substrate on substrate table WT. Note that the operation of exchanging substrates as described with reference to FIG. 11 may occur in the lithographic apparatus of each of the embodiments shown in FIGS. 6 to 10, except that the liquid displacement device 20, 20a and 20b and its location may be different.

In an embodiment, the liquid displacement device 20c is positioned so that it sweeps across a sensor/target ST mounted on substrate table WT when the table moves under the liquid displacement device 20c. The liquid displacement device may be on a securing device, such as a rail SR. The liquid displacement device 20c may function as previously described. When the liquid displacement device 20c is operating to supply a gas flow, the liquid displacement device may sweep across the sensor/target ST. In an embodiment, the arrangement of a sensor/target ST on substrate table WT and the path taken by substrate table WT in moving from the unload to the load positions is desirably such that a single liquid displacement device 20c may displace liquid from all the sensors/targets ST present on the substrate table, which may be one sensor/target ST. In an embodiment as shown in FIG. 11 there may be two or more sensors/targets ST. However, in the event that the position of the sensors/targets ST on substrate table WT or the path of substrate table WT may not allow all sensors/targets ST to be swept by a single liquid displacement device, an additional liquid displacement device may be located at a suitable position so that all the sensors/targets ST may be swept of liquid. For example, in an embodiment, two sensors/targets ST are situated on each substrate table at diagonally opposite corners and two liquid displacements devices are provided. If a lithographic apparatus has multiple load/unload stations, a corresponding number of liquid displacements devices may be provided.

In this embodiment, liquid displacement device 20c may be of the type of liquid displacement device 20, 20a, 20b shown and described in reference to any of FIGS. 6 to 10.

Figure 12:
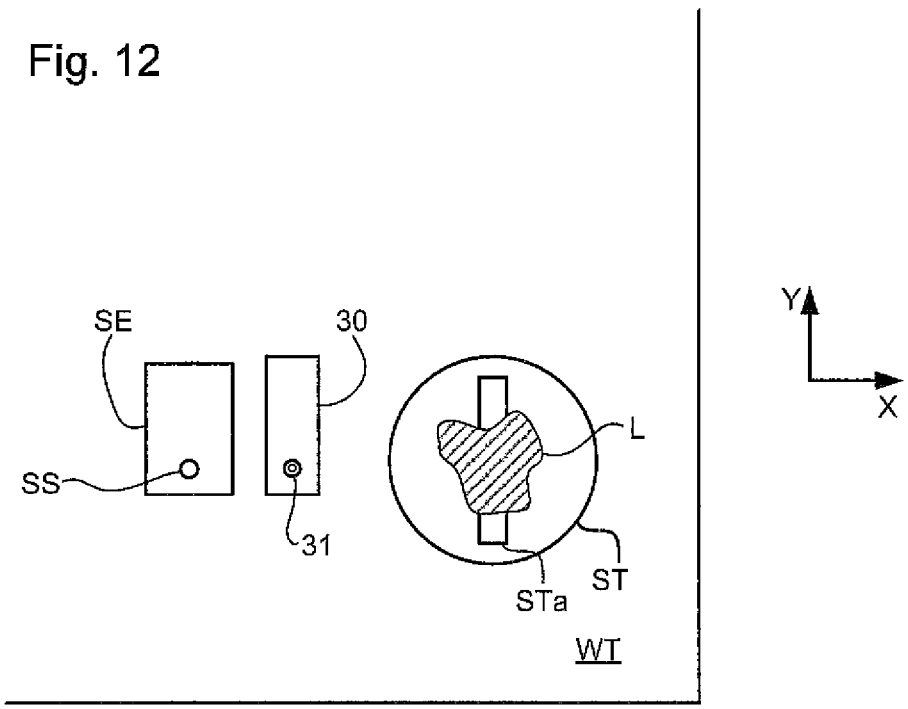
FIG. 12 depicts a liquid displacement device according to an embodiment of the invention.
Figure 13:
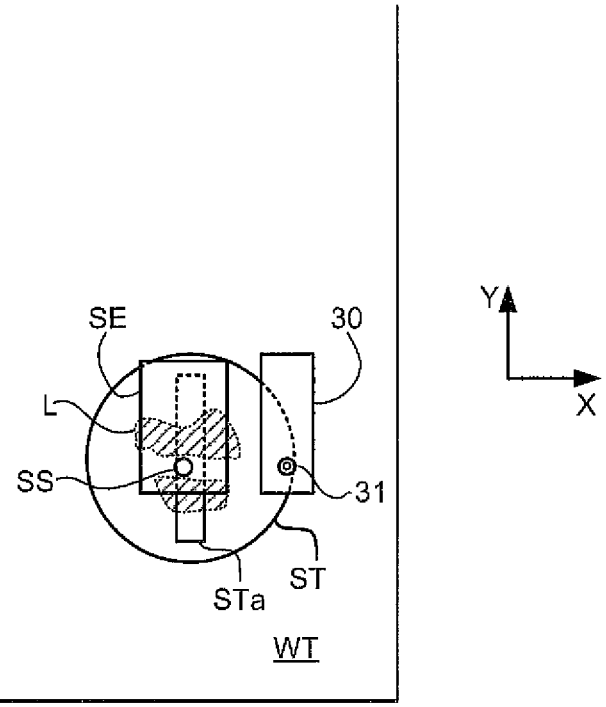
FIG. 13 depicts the effect of operation of the liquid displacement device of FIG. 12.

In an embodiment, there is a liquid displacement device 30 according to a further embodiment of the invention which is shown in FIGS. 12 and 13. The liquid displacement device 30 may be adjacent a sensor SE. Sensor SE may be used to measure a property of a substrate W or the substrate table WT. The sensor operates by taking a measurement of a small area of the substrate table WT. The small area is a sensor spot SS. In an embodiment, the liquid displacement device 30 comprises a gas nozzle 31 of similar size to the sensor spot SS. The gas nozzle faces a surface of the substrate table WT. The liquid displacement device 30 is arranged to be positioned ahead of the sensor spot SS when the sensor and/or substrate table are moved, e.g. scanned, relative to the other for a measurement. When a measurement scan is performed, the liquid displacement device 30 is activated as the sensor/target ST is approached. After activation, the liquid displacement device emits a high volume and/or high velocity gas flow from the nozzle 31. As shown in FIG. 13, this has the effect of displacing liquid L from the sensor/target ST at the position where a measurement is to be taken. A droplet may cover the sensor/target ST. An area of the sensor/target ST from which the droplet is removed may be measured. The liquid may be displaced away from the area or it may separated into separate areas, leaving the area to be measured free of liquid. The area from which liquid is removed may be any area of the sensor/target ST ranging from the area being measured or the entire sensor/target ST.

In an embodiment the nozzle 31 may be shaped to direct a gas flow to direct liquid away from the sensor/target ST. The nozzle may direct a flow of gas that has an acute angle with respect to the surface of the substrate table WT, the nozzle may be acutely angled with respect to the substrate table. The nozzle 31 may widen towards its opening. Associated with the nozzle may be a fluid extraction opening (not shown) through which the liquid may be removed. The liquid may be extracted in a two phase fluid flow. A droplet (not shown), may be displaced away from the area to be measured.

The volume of the gas flow from the nozzle sufficient to displace residual liquid will depend on several factors. The factors may include the size of the area to be cleaned of liquid, the thickness of liquid to be displaced and/or the size of a droplet to be displaced. In an embodiment, the gas flow may be in the range of from 0.3 to 3 l/min/mm$^2$ of the nozzle section. In an embodiment, the gas may be: air; a clean, dry gas, such as air; a gas which is an artificial air; and/or $N_2$ or another inert gas, such as a noble gas.

In an embodiment, the liquid displacement device is connected to an actuator (not shown) to allow it to be raised when not operative and lowered when operative. As in the embodiment of FIGS. 6 and 7, this actuator may be, for example, a solenoid or a motor and cam or a pneumatic system. In an embodiment, the liquid displacement device 30 is mounted so as to be displaceable vertically relative to the substrate table WT. The nozzle 31 may have an operative position and a storage position. In an operative position, the nozzle 31 is positioned close to the substrate table. In a storage position the nozzle 31 is removed away from the substrate table WT. The liquid displacement device 30 may be biased, e.g. resiliently biased by for example a spring, to a position array away from the substrate or substrate table. The actuator may be a bellows or a piston that may be filled by gas when the gas supply is activated. The bellows or piston is arranged so that when filled with gas it urges the nozzle 31 to the operative position.

Although the liquid displacement device 30 is described to be adjacent the sensor SE, it may be located so that it scans a sensor/target ST before the sensor SE is adjacent the sensor/target ST. The sensor/target ST may have a path which passes first under the liquid displacement device 30 and then the sensor SE. The sensor SE may be any type of sensor which together with the sensor/target ST operates to take a measurement of a property of the substrate table and/or substrate. Such a property may include: the height of a point or an area of the surface of a substrate relative to a reference plane, the surface contour of a part or all of a substrate; and/or the position of a marker on a substrate relative to the sensor or a reference on the substrate.

In an embodiment the sensor SE is a gas (e.g., air) gauge. As a gas gauge, the sensor SE may measure the height of a substrate W using a flow of gas, such as air. In an embodiment, the gas gauge sensor SE and the liquid displacement device 30 may be combined in a single device. In such a combined device there is a controller. The controller is connected to a gas supply or a gas pump. The controller is configured to cause a high rate of gas to flow through a nozzle to displace liquid from the target before a measurement is made. The controller may cause there to be a delay between operation to displace liquid and operation to measure the height in order for the gas flow to stabilize. In an embodiment a liquid removal operation is performed before every measurement. In an embodiment, a liquid removal operation is performed if liquid is detected on the sensor or target, e.g. if a measurement result is erroneous or out of a valid range. Gas flow from the nozzle may be switched on and off as required for liquid removal and measurement or continuous, with the flow rate changed as required.

The liquid displacement device 30 of FIGS. 12 and 13 may be used in place of the liquid displacement device 20, 20a, 20b, 20c in any of the above described embodiments.

In an embodiment, each table of a lithographic apparatus (e.g., a substrate table to support a substrate and a measurement table MT to measure parameters of components of the lithographic apparatus and/or substrate) has a positioner to displace the table in at least two directions, e.g. X and Y. The directions may be parallel to the plane of a substrate held on a substrate table. The liquid displacement device 20, 20a, 20b, 20c, 30 may be actuated in the perpendicular direction, e.g. Z. In an embodiment, the liquid displacement device may be fixed and the table may be displaceable in three orthogonal directions or more by a positioner. In an embodiment, the liquid displacement device may be displaceable by a positioner in two or more directions, whether or not the one more tables of the lithographic apparatus are fixed or displaceable.

It is desirable to remove a droplet from a surface on which it is present, such as the substrate table, as soon as possible. The longer the droplet is left on the surface the larger the heat load that may be applied to the surface. Therefore it is desirable for the liquid displacement device to be operated soon after the droplet forms on the surface. The liquid displacement device may be desirably located close to the source of the droplet. For example, the liquid displacement device 20, 20a, 30 may be close or even as part of a liquid confinement structure 12. Such a liquid displacement device 20, 20a, 30 may displace the droplet soon after it is formed. A liquid displacement device 20b which operates around substrate swap incurs a delay of, for example, about three seconds. A liquid displacement device 20c which operates during the loading and/or unloading of a substrate may operate a longer time after the formation of the droplet, for example about five to six seconds after formation of the droplet. A liquid displacement device 30 which removes the droplet during measurement may be a comparatively slow system, but desirably it removes the droplet.

Figure 14:
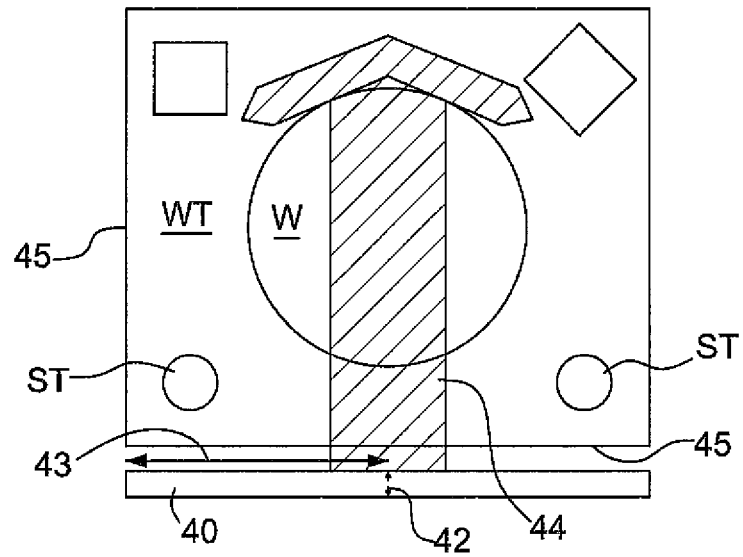
FIG. 14 depicts a liquid displacement device according to an embodiment of the invention.

FIG. 14 shows a liquid displacement device 40 which is configured as described in any of the embodiments described above, except as described as follows. In an embodiment, a dimension of the liquid displacement device perpendicular to the relative motion between the substrate table WT and the liquid displacement device 40, such as the length of the liquid displacement device, is at least the width of the substrate table WT, e.g. the length of an edge 45 of the substrate table WT. As the substrate table moves under the liquid displacement device 40, liquid such as in the form of a droplet will be removed from everywhere on the substrate table in one pass, as shown by arrow 44.

The substrate table may be dried as it is moved from an exposure position towards a position where substrate swap occurs. In an embodiment the liquid removal device operates after the exposed substrate W is removed and before another substrate is placed on the substrate table WT. In an embodiment the liquid displacement device operates before substrate swap, with the substrate W still in position on the substrate table. The exposed surface of a substrate on the substrate table will then be dried before it is removed from the substrate table WT. This is desirable as it avoids drying the substrate after removal. At the same time the substrate table surface and a sensor ST or target ST present on the substrate table is dried. Drying the substrate W before removal may help because drying of the surface of the substrate table under the substrate may not be necessary because liquid is absent there; however, removal of a wet substrate may allow liquid to flow on the previously covered surface of the substrate table which is undesirable.

In an embodiment, the dimension of the liquid removal device is at least a fraction of the width of the substrate table, for example a half of the length of a side 45, as shown by the dotted line 42, indicating a liquid removal device of half the length as described in the previous paragraph. The length of the liquid removal device is indicated by arrow 43. Such a liquid removal device 40 may scan twice relative to the surface of the substrate table, as shown by the arrows 46, 48 in FIG. 15. The entire surface of the substrate table may be dried by the liquid removal device using a liquid removal device 40 of limited dimensions. The liquid removal device 40 may be a different, e.g., smaller, fraction of the width of the substrate table, for example a third, a fourth, a fifth or any fraction enabling a limited number of scans of the substrate table surface. A smaller number of scans is desirable because it enables an improved throughput. In an embodiment, it is desirable that the length of the liquid removal device 40 is a little longer than a fraction of the length of an edge of the substrate table corresponding to the scans used to scan the entire substrate table (e.g., little longer than ½ where two scans used, little longer than ⅓ where three scans are used, etc.). This may be because it is desirable for the widths of the scans to overlap to help ensure that substantially the entire surface of the substrate table is dried.

Figure 15:
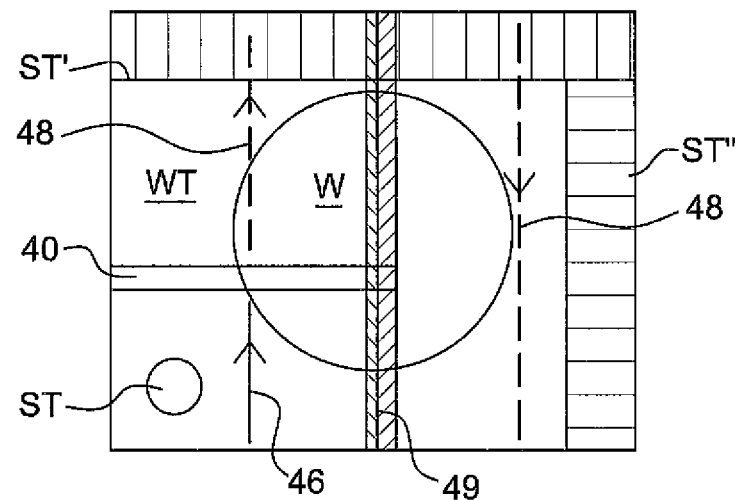
FIG. 15 depicts a liquid displacement device according to an embodiment of the invention.

FIG. 15 shows a liquid removal device 40 while scanning over the substrate table WT. A solid arrow is the completed scan path 46. A dotted arrow represents the rest of the scan path 48 of the liquid removal device 40 relative to the surface of the substrate table. The substrate table features a target ST or sensor ST. The substrate table has a sensor and/or target ST', ST'', which extends along the length of one or more edges 45 of the substrate table WT. In FIG. 15, one sensor target ST' is along an edge of the substrate table WT which is perpendicular to the scan path 46, 48 of the liquid removal device 40. One sensor target ST' is along an edge of the substrate table WT which is parallel to the scan path 46, 48. The sensor and/or target ST', ST'' may be, for example, an encoder grid which can be used in measuring the position of the substrate table relative to the projection system.

Having a liquid removal device 40 which scans along the full length 45 of the substrate table WT (perpendicular to the length of the liquid removal device) is desirable because it enables the full length of the sensor/target ST'' to be dried in one scan movement. However with a liquid removal device which has a length that is a fraction of the length of an edge of the substrate table WT, the scan path may overlap a previously scanned surface 49 Overlapping scan paths of a liquid removal device may be a risk for a droplet and their associated problems. For this reason it desirable to have a liquid removal device as long as possible, and so to have as few scan movements as possible.

In an embodiment, the considered dimension is the length of the liquid removal device 40 along the scanning or stepping direction, rather than just the length of the liquid removal device 40. The scanning direction, stepping direction or both directions may be parallel to an edge 45 of the substrate table WT. In such an arrangement the considered dimension of the liquid removal device 40 may be perpendicular to the relative motion of the substrate table and the liquid removal device 40. The length of the liquid removal device 40 could then be angled in the plane of the substrate table, relative to the scanning or stepping direction.

Embodiments of the aforementioned arrangements may operate with a substrate W present on the substrate table WT or without a substrate W present on the substrate table WT.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment, there is provided a lithographic apparatus comprising: a table, a liquid handling structure and a liquid displacement device. The table is configured to support a substrate, a sensor, or both the substrate and the sensor. The table has a surface and a sensor, a target for a sensor on the surface, or both the sensor and the target. The liquid handling structure is configured to provide liquid to a space adjacent the substrate and/or table. The liquid displacement device comprises a gas outlet. The gas outlet is configured to direct a localized gas flow toward the sensor and/or target so as to displace liquid from the sensor and/or target.

The lithographic apparatus may comprise an alignment sensor. The target may include a mark that is detectable by the alignment sensor.

The lithographic apparatus may comprise a height sensor. The target may include a reference plane for the height sensor. The height sensor may be a gas gauge.

The target may include a grid mounted to the surface of the table. The apparatus may comprise an encoder configured to measure displacement of the table in cooperation with the grid.

The lithographic apparatus may comprise a positioner. The positioner may be arranged to displace the table relative to the liquid displacement device. The positioner may be arranged to scan a part of the surface of the table past the liquid displacement device.

In an embodiment the gas flow is a gas knife. The liquid displacement device may comprise an opening. The opening may be configured to remove liquid. The opening may be connected to an underpressure source.

The lithographic apparatus may comprise: a measurement station, an exposure station, and a table transfer device. The measurement station may have a sensor configured to measure a property of the table. The exposure station may have a projection system configured to project an image onto a substrate supported by the table. The table transfer device may be configured to transfer the table between the measurement and exposure stations along a transfer path. The liquid displacement device may be positioned adjacent the transfer path. The liquid displacement device may be positioned so as not to adjoin the transfer path.

The lithographic apparatus may comprise a measurement station. The measurement station may have a sensor configured to measure a property of the table, The liquid displacement device may be positioned in the measurement station.

The lithographic apparatus may comprise a loading device. The loading device may be configured to load a substrate onto the table. The liquid displacement device may be positioned adjacent the loading device.

The liquid displacement device may be mounted to the liquid handling structure. The maximum dimension of the gas flow in a direction parallel to the plane of the surface may be no greater than 115%, and desirably no greater than 110%, of the maximum dimension of the sensor and/or target in the direction. In an embodiment the liquid handling structure does not comprise a gas knife.

The lithographic apparatus may comprise an actuator. The actuator may be configured to displace the liquid displacement device in a direction perpendicular to the plane of the surface. The target and/or sensor may comprise a plurality of targets and/or sensors that are spaced apart from each other. The apparatus may comprise a plurality of liquid displacement devices, each liquid displacement device being associated with one or more of the targets and/or sensors.

In an embodiment, there is provided a device manufacturing method comprising: projecting, unloading, loading, measuring or using, and displacing. In the projecting, an image of a pattern is projected through an immersion liquid onto a first substrate held by a substrate table having a target, a sensor, or both the target and sensor. In the unloading, the first substrate is unloaded from the substrate table. In the loading, a second substrate is loaded onto the substrate table. In the measuring or using, a property of the target is measured or the sensor is used while the second substrate is held by the substrate table. In the displacing, liquid from the target and/or the sensor is displaced using a localized gas flow.

The displacing may be performed after the projecting and before the unloading. The method may comprise transferring the substrate table from an exposure station to a loading station after the projecting and before the unloading. The displacing may be performed in parallel with the transferring.

The method may comprise transferring the substrate table from an exposure station to a loading station after the projecting and before the unloading. The displacing may be performed before the transferring.

The displacing may be performed after the unloading and before the loading. The displacing may be performed in parallel with the unloading. The displacing may be performed in parallel with the loading. The displacing may be performed after the loading and before the unloading.

The method may comprise detecting whether the measuring has been correctly performed and repeating the displacing and measuring if the measuring has not been correctly performed. Measuring the property of the target may comprise measuring the position of the target relative to a sensor.

In an embodiment, there is provided a device manufacturing method comprising: projecting, moving, unloading, measuring or using, and displacing. In the projecting, an image of a pattern is projected through an immersion liquid onto a first substrate held by a substrate table, the immersion liquid being confined between a projection system and the substrate by a liquid confinement structure. In the moving, the liquid confinement structure is moved to a measurement table having a target, a sensor, or both the target and sensor, or the measurement table is moved to the liquid confinement structure. In the unloading, the first substrate is unloaded from the substrate table. In the loading, a second substrate is loaded onto the substrate table. In the measuring or using, a property of the target is measured or the sensor is used. In the displacing, liquid from the target and/or sensor is displaced using a localized gas flow.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
a table configured to support a substrate, a sensor, or both the substrate and the sensor, the table having a surface and a sensor, a target for a sensor on the surface, or both the sensor and the target;
a liquid handling structure to provide liquid to a space adjacent the substrate and/or table;
a plurality of liquid displacement devices spaced apart from one another, each liquid displacement device comprising:
a gas outlet configured to direct a localized gas flow toward the sensor and/or target so as to displace liquid from the sensor and/or target, the gas flow being in the form of an elongate, substantially straight gas knife set at an angle between 0 and 90 degrees in a plane substantially parallel to a top surface of the sensor and/or target and to a scan direction of the table relative to the liquid handling structure, and
a two-phase extraction port configured to remove the displaced liquid, the two phase extraction port positioned adjacent to an end of the gas knife; and
a controller configured to control relative displacement between the liquid displacement devices and the sensor and/or target so that the localized gas flow of each liquid displacement device simultaneously traverses a path substantially parallel to and adjacent a different side of the table.

2. The lithographic apparatus of claim 1, further comprising an alignment sensor and wherein the target includes a mark that is detectable by the alignment sensor.

3. The lithographic apparatus of claim 1, further comprising a height sensor and wherein the target includes a reference plane for the height sensor.

4. The lithographic apparatus of claim 1, wherein the target includes a grid mounted to the surface of the table and the apparatus further comprises an encoder configured to measure displacement of the table in cooperation with the grid.

5. The lithographic apparatus of claim 1, further comprising a positioner arranged to displace the table relative to the liquid displacement devices.

6. The lithographic apparatus of claim 1, further comprising:
a measurement station having a sensor configured to measure a property of the table;
an exposure station having a projection system configured to project an image onto a substrate supported by the table; and
a table transfer device configured to transfer the table between the measurement and exposure stations along a transfer path,
wherein the liquid displacement devices are positioned adjacent the transfer path.

7. The lithographic apparatus of claim 1, further comprising a measurement station having a sensor configured to measure a property of the table, wherein the liquid displacement devices are positioned in the measurement station.

8. The lithographic apparatus of claim 1, further comprising a loading device configured to load a substrate onto the table, wherein the liquid displacement devices are positioned adjacent the loading device.

9. The lithographic apparatus of claim 1, wherein the maximum dimension of the gas flow in a direction parallel to the plane of the surface is no greater than 115% of the maximum dimension of the sensor and/or target in the direction.

10. The lithographic apparatus of claim 9, wherein the liquid handling structure does not comprise a gas knife.

11. The lithographic apparatus of claim 1, further comprising an actuator to displace at least one of the liquid displacement devices in a direction perpendicular to the plane of the surface.

12. The lithographic apparatus of claim 11, wherein the actuator is configured to displace the at least one liquid displacement device with respect to the liquid handling structure.

13. A device manufacturing method comprising:
projecting an image of a pattern onto a substrate, wherein a table supports the substrate, a sensor, or both the substrate and the sensor, the table having a surface and a sensor, a target for a sensor on the surface, or both the sensor and the target;
providing liquid to a space adjacent the substrate and/or table using a liquid handling structure; and
directing a localized gas flow toward the sensor and/or target using a gas outlet of each of a plurality of spaced-apart liquid displacement devices so as to displace liquid from the sensor and/or target, the gas flow being in the form of an elongate, substantially straight gas knife set at an angle between 0 and 90 degrees in a plane substantially parallel to a top surface of the sensor and/or target and to a scan direction of the table relative to the liquid handling structure;
removing the displaced liquid using a two phase extraction port, the two phase extraction port positioned adjacent to an end of the gas knife; and
controlling relative displacement between the liquid displacement devices and the sensor and/or target so the localized gas flow of each liquid displacement device simultaneously traverses a path substantially parallel to and adjacent a different side of the table.

14. The method of claim 13, further comprising displacing at least one of the liquid displacement devices in a direction perpendicular to the plane of the surface with respect to the liquid handling structure.

15. The method of claim 13, wherein the maximum dimension of the gas flow in a direction parallel to the plane of the surface is no greater than 115% of the maximum dimension of the sensor and/or target in the direction.

16. The method of claim 13, wherein a measurement station has a sensor configured to measure a property of the table, an exposure station has a projection system configured to project an image onto a substrate supported by the table, and a table transfer device transfers the table between the measurement and exposure stations along a transfer path, wherein the liquid displacement devices are positioned adjacent the transfer path.

17. The method of claim 13, wherein the target includes a grid mounted to the surface of the table and further comprising measuring displacement of the table using an encoder in cooperation with the grid.

18. A lithographic apparatus comprising:
a table configured to support a radiation-sensitive substrate, a sensor, or both the substrate and the sensor, the table having a surface and a sensor, a target for a sensor on the surface, or both the sensor and the target;

a projection system configured to project an image onto the substrate;

a liquid handling structure to provide liquid to a space adjacent the substrate and/or table;

a plurality of liquid displacement devices located above the table, the liquid displacement devices spaced apart from the liquid handling structure and from one another, each liquid displacement device configured to provide a liquid displacement zone to displace liquid from the sensor and/or target; and a controller configured to control relative displacement between the liquid displacement devices and the sensor and/or target such that the liquid displacement zone of each liquid displacement device simultaneously traverses a path substantially parallel to and adjacent a different side of the table.

19. The apparatus of claim 18, wherein each liquid displacement device is configured to form an elongate, substantially straight liquid displacement zone set at an angle between 0 and 90 degrees in a plane substantially parallel to a top surface of the sensor and/or target and to the relative displacement.

20. The apparatus of claim 18, comprising more than two liquid displacement devices and the controller is configured to control the relative displacement such that the liquid displacement zone of two liquid displacement devices simultaneously traverse a path substantially parallel to and adjacent a different side of the table.

21. The apparatus of claim 18, wherein at two of the liquid displacement devices are spaced apart by about the distance of a width of the substrate.

* * * * *